(12) United States Patent
Huang et al.

(10) Patent No.: US 10,407,549 B2
(45) Date of Patent: Sep. 10, 2019

(54) PHOTOSENSITIVE POLYIMIDE RESIN COMPOSITION AND METHOD OF MANUFACTURING COVER FILM USING THE SAME

(71) Applicant: Microcosm Technology CO., LTD, Tainan (TW)

(72) Inventors: Tang-Chieh Huang, Tainan (TW); Kunhan Hsieh, Tainan (TW)

(73) Assignee: Microcosm Technology Co., Ltd, Tainan (TW)

(*) Notice: Subject to any disclaimer, the term of this patent is extended or adjusted under 35 U.S.C. 154(b) by 10 days.

(21) Appl. No.: 15/689,402

(22) Filed: Aug. 29, 2017

(65) Prior Publication Data

US 2018/0346652 A1 Dec. 6, 2018

(30) Foreign Application Priority Data

Jun. 2, 2017 (TW) .............................. 106118252 A

(51) Int. Cl.

| C08G 73/10 | (2006.01) |
| C08G 59/02 | (2006.01) |
| C08L 79/08 | (2006.01) |
| C09B 57/10 | (2006.01) |
| C09B 69/10 | (2006.01) |
| G03F 7/038 | (2006.01) |
| G03F 7/16 | (2006.01) |
| G03F 7/40 | (2006.01) |
| G03F 7/075 | (2006.01) |

(52) U.S. Cl.
CPC ......... *C08G 73/1042* (2013.01); *C08G 59/02* (2013.01); *C08G 73/106* (2013.01); *C08G 73/1046* (2013.01); *C08L 79/08* (2013.01); *C09B 57/10* (2013.01); *C09B 69/10* (2013.01); *G03F 7/0384* (2013.01); *G03F 7/0387* (2013.01); *G03F 7/0757* (2013.01); *G03F 7/168* (2013.01); *G03F 7/40* (2013.01); *C08L 2666/70* (2013.01)

(58) Field of Classification Search
None
See application file for complete search history.

(56) References Cited

U.S. PATENT DOCUMENTS

2002/0001763 A1* 1/2002 Yasuno ............... C08G 73/106
430/18

* cited by examiner

*Primary Examiner* — Ana L. Woodward
(74) *Attorney, Agent, or Firm* — Haverstock & Owens LLP

(57) ABSTRACT

A photosensitive polyimide resin composition is provided. The resin composition comprises an infrared absorber, an epoxy, a photosensitive polyimide and a photo initiator. The infrared absorber includes pigment and has an amount of weight accounting for 5-40% of total solid weight of the photosensitive polyimide resin composition. The epoxy has an amount of weight accounting for 5-40% of total solid weight of the photosensitive polyimide resin composition. The photosensitive polyimide has the structure of formula (1):

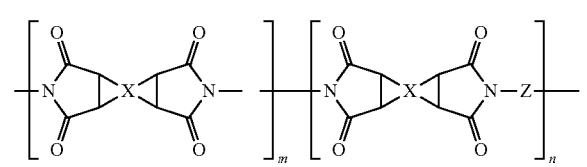

(1)

wherein m, n are independently 1 to 600; X is a tetravalent organic group, and the main chain of X includes alicyclic structure; Y is a divalent organic group, and the main chain of Y includes siloxane structure; Z is a divalent organic group, and the side chain of Z includes phenolic hydroxyl group or carboxyl group. The photosensitive polyimide has an amount of weight accounting for 30-90% of total solid weight of the photosensitive polyimide resin composition. The photo initiator has an amount of weight accounting for 0.1-15% of total solid weight of the transparent photosensitive resin.

10 Claims, No Drawings

PHOTOSENSITIVE POLYIMIDE RESIN COMPOSITION AND METHOD OF MANUFACTURING COVER FILM USING THE SAME

BACKGROUND OF THE INVENTION

Field of the Invention

The present invention discloses a photosensitive polyimide resin composition, in particular a fast crosslinking type photosensitive polyimide resin composition.

Description of the Prior Art

The conventional photosensitive polyimide is derived from its precursor—polyamic acid or polyamide ester, which, after the lithography process, requires curing at a high temperature of 350° C. to form polyimide. For copper lines, heating to 350° C. would cause oxidation problems.

Another soluble photosensitive polyimide material can be used for high-order flexible substrate cover films. Refer to U.S. Patent Publication Nos. US2003/0176528, US2004/0247908, US2004/0265731 or US2004/0235992. Although this type of soluble photosensitive polyimide can be cured at a low temperature of 230° C., the flame retardant property thereof is poor since the content of the photosensitive molecule (acrylate) is too high, Therefore, it is needed to add the flame retardant containing phosphorus or halogen, which does not meet the environment protection trend of halogen-free and phosphorus-free in the future. Though the hard baking temperature of the soluble PSPI material is lower, its solvent resistance is generally poor, and a high concentration of alkaline developer is required for the development, resulting in low practicality.

Another soluble polyimide having a —COOH group on its main chain was proposed by Masao Tomoi et al, in the journal of *Reactive & Functional Polymers*, 2003(56), p. 59-73 as well as Japanese Patent Publication Nos. JP2002341535 and JP2003345007. The acrylic acid (ester) monomer with the tertiary amine group was used to ionically bond to the —COOH group to form the negative type PSPI material. However, the ionic bonding of the acrylic acid (ester) monomer with the —COOH group required high temperature and long baking, and there are still some problems.

SUMMARY OF THE INVENTION

The present invention provides a photosensitive polyimide resin composition, which is prepared by adding to a photosensitive polyimide an infrared absorber having the maximum absorption and the minimum absorption in a specific wavelength range, thereby resolving the problems of high temperature and long baking required in the conventional polyimide process.

According to an embodiment of the present invention, a photosensitive polyimide resin composition is provided. The resin composition comprises (a) an infrared absorber, (b) an epoxy compound, (c) a photosensitive polyimide, and (d) a photo initiator. The infrared absorber is a dye or a pigment, has a maximum absorption wavelength of 500-4000 nm in a solvent and a heat conversion rate of greater than 70%, and accounts for 5-40% of the solid weight of the photosensitive polyimide resin composition. The epoxy compound accounts for 5-40% of the solid weight of the photosensitive polyimide resin composition. The photosensitive polyimide has a structure of formula (1):

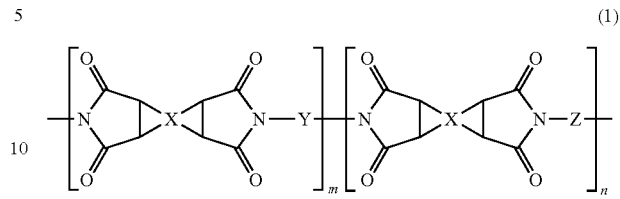

wherein m and n are independently 1 to 600; X is a tetravalent organic group, a main chain of which contains an alicyclic group; Y is a divalent organic group, a main chain of which contains a siloxane group; Z is a divalent organic group, a side chain of which at least contains a phenolic group or a carboxyl group; and the photosensitive polyimide accounts for 30-90% of the solid weight of the photosensitive polyimide resin composition. The photo initiator accounts for 0.1-15% of the solid weight of the photosensitive polyimide resin composition.

In an embodiment, the dye serving as the infrared absorber is a metal complex dye or a condensed polycyclic dye.

In an embodiment, the pigment serving as the infrared absorber is an organic pigment or an inorganic pigment.

In an embodiment, the epoxy compound is neopentyl glycol diglycidyl ether, 1,4-butanediol diglycidyl ether, 1,2-cyclohexanedicarboxylic acid diglycidyl ester, bisphenol A diglycidyl ether, 1,2-propanediol diglycidyl ether, trimethylolpropane triglycidyl ether, glycerol tripropoxy triglycidyl ether, m-benzenediol diglycidyl ether, or a combination thereof.

In an embodiment, X in the polyimide of formula (1) doesn't contain a benzene ring.

In an embodiment, X in the polyimide of formula (1) is

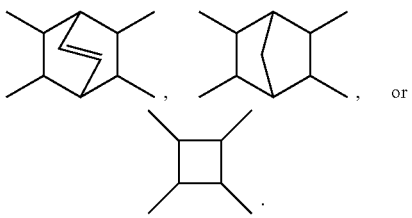

In an embodiment, Y in the polyimide of formula (1) is

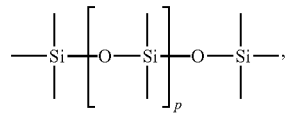

wherein p=0-20.

In an embodiment, the phenolic group or the carboxyl group of Z in the polyimide of formula (1) accounts for 5-30% of the total number of moles of the photosensitive polyimide.

In an embodiment, Z in the polyimide of formula (1) is

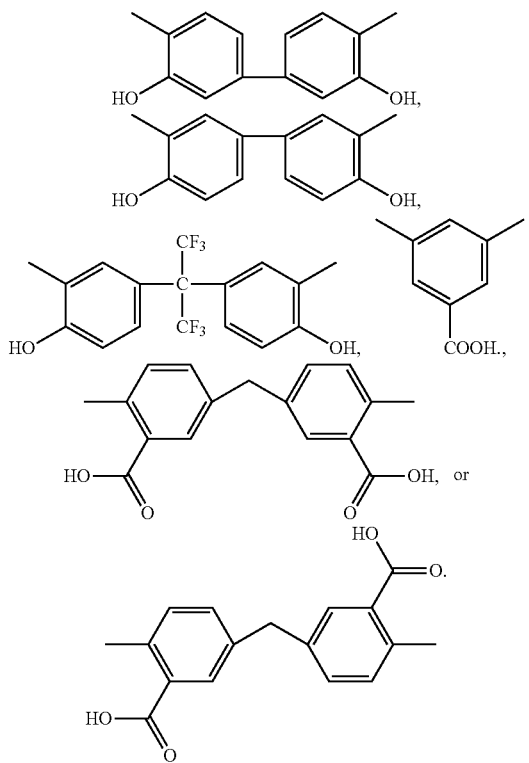

In an embodiment, the photo initiator is bis(2,4,6-trimethylbenzoyl)-phenylphosphine oxide, 2-phenylmethyl-2-dimethylamino-1-1-(4-morpholinophenyl)-butanone, (2,4,6-trimethylbenzyl)diphenylphosphine oxide, bis(2,6-difluoro-3-(1-hydropyrro-1-yl)-phenyl)titanocene, 4,4'-bis(dimethylamino)diphenyl ketone, 4,4'-bis(diethylamino) diphenyl ketone, or N-phenyl diethanolamine.

The photosensitive polyimide resin composition described above can be used to for an insulating film.

A method for manufacturing a cover film is further provided by the present invention. The cover film is obtained by coating the photosensitive polyimide resin composition described above on a substrate and then drying the photosensitive polyimide resin composition.

In an embodiment, the substrate surface has a color and can absorb infrared rays having a wavelength of 500-4000 nm, and the drying is carried out by irradiating the photosensitive polyimide resin composition with an infrared lamp emitting the infrared rays having a wavelength of 500-4000 nm for curing.

In an embodiment, the infrared lamp described above includes the infrared halogen lamp, the infrared quartz tube, and the infrared blackbody tube.

In the present invention, the addition of the infrared absorber to the photosensitive polyimide resin composition can solve the problem that the formation of ionic bonding between the acrylic acid (ester) monomer and the —COOH group requires high temperature and long baking, thereby meeting the needs for high-order flexible substrate having high density and fine lines.

The foregoing and other aspects of the present invention will be clearer from the following detailed description of the embodiments.

DETAILED DESCRIPTION OF THE EMBODIMENTS

The present invention provides a photosensitive polyimide resin composition having a photosensitive polyimide of a particular molecular structure as the main component and solves the problems of high temperature and long baking during shaping by adding the infrared absorber.

The photosensitive polyimide resin composition of the present invention may further be added the thermal crosslinking agent having a phenolic compound or an alkoxymethylamine resin in its structure so that the terminal group on the molecular chain of the polyimide forms a crosslinking structure with the thermal crosslinking agent in order to improve the chemical resistance and film-forming capability of the polyimide. The acrylic resin photocrosslinking agent may also be added to produce the acid upon exposure, thereby forming the acid-catalyzed crosslinking mechanism.

The photosensitive polyimide resin composition of the present invention comprises (a) an infrared absorber, (b) an epoxy compound, (c) a photosensitive polyimide, and (d) a photo initiator.

The infrared absorber of the component (a) comprises dyes and pigments, and the dyes having a maximum absorption wavelength of 500 to 1000 nm, preferably 700 to 1000 nm, and more preferably 800 to 1000 nm, may be used. The dye used may include the metal complex dyes or the condensed polycyclic dyes, such as the phthalocyanine dyes, the porphyrin dyes, the cyanine dyes, the Quaterrylene dyes, the squaraine dyes, the azo dyes, the ammonium dyes, the anthraquinone series, the diimine series, the naphthalocyanine dyes, the nickel complex dyes, the copper ion dyes, the dithiol metal complexes, the heterocyclic compounds, and the like, among which the heterocyclic compounds, the Quaterine dyes, the phthalocyanine dyes, and the naphthalocyanine dyes that also have absorption in the range of visible light are preferred. The actual products of dyes are, for example, SDO-C8, SDO-C33, Lumogen IR 765, Lumogen IR 788, and the like. Further, it is preferred that the dye has the maximum absorption in the above wavelength range, can efficiently absorb light, has a sensitizing effect, and contains the metal complex. One or more of the dyes described above may be used as the infrared absorber of the present invention.

The pigment serving as the infrared absorber of the present invention comprises the organic pigment and the inorganic pigment. Among the organic pigments, the phthalocyanine series, dioxazine series, and perylene series are preferred due to their excellent photo-curing property, coloring property, and shading property in the range of visible light. Specific and preferred examples include Pigment Blue of the phthalocyanine series, Lumogen Black FK4280 and Lumogen Black FK4281 of the perylene series, and PigmentViolet 23 and 37 of the oxazine series. The pigments mentioned above may be used alone or in proper combination with two or more of others. The inorganic pigments comprise cobalt(II,III) oxide, titanium black, carbon black, etc., and may be used alone or in proper combination with two or more of others. In the photosensitive resin composition of the present invention, the content of the infrared absorber (a) accounts for 0.5 to 40% of the solid weight of the photosensitive polyimide resin composition.

The main purpose of the addition of (b) epoxy compound is to make the epoxy compound crosslink with the —OH group or —COOH group on the main chain or the ortho position of the terminal —OH group or —COOH group of the photosensitive polyimide through acid catalysis or heat treatment during hard baking after the exposure. The content of the epoxy compound accounts for about 5 to 40% of the solid weight of the photosensitive polyimide resin composition. If it is less than 5%, then the hard-baked product will be insufficiently crosslinked and less resistant to chemical solvents; and if it exceeds 40%, then the developability is poor. The epoxy compound may be neopentyl glycol diglycidyl ether, 1,4-butanediol diglycidyl ether, 1,2-cyclohexanedicarboxylic acid diglycidyl ester, bisphenol A diglycidyl ether, 1,2-propanediol diglycidyl ether, trimethylolpropane triglycidyl ether, glycerol tripropoxy triglycidyl ether, m-benzenediol diglycidyl ether, or any combinations thereof.

The photosensitive polyimide of component (c) is the photosensitive polyimide having the structure of formula (1):

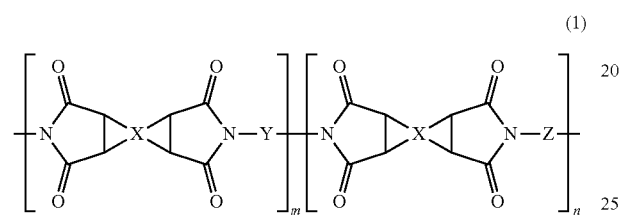

(1)

in which m and n are independently 1 to 600. X is a tetravalent organic group, the main chain of which contains the alicyclic group, preferably the alicyclic group having no benzene ring, including (but not limited to)

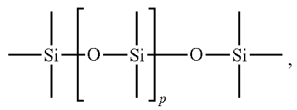

Y is a divalent organic group, a main chain of which contains the siloxane group, such as:

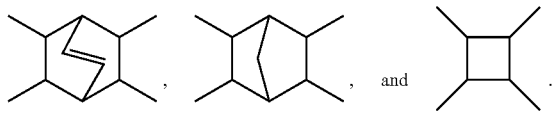

in which the chain length of Y is preferably short (p=0), and the longest chain length of Y may be p=20. If the chain length is too long, the properties of the polyimide will be deteriorated. Z is a divalent organic group, a side chain of which at least contains the phenolic group or carboxyl group. The phenolic group or the carboxyl group approximately accounts for 5 to 30% of the number of moles of the polyimide. The development time may be controlled by adjusting the molar ratio of the side chain cover group, and when the content of the branched phenol group or carboxyl group is high, the alkaline developer is preferred due to its better solubility and may improve the developability. Z may include, but not be limited to, the following groups:

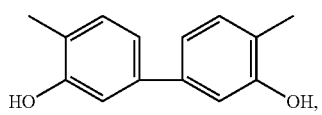

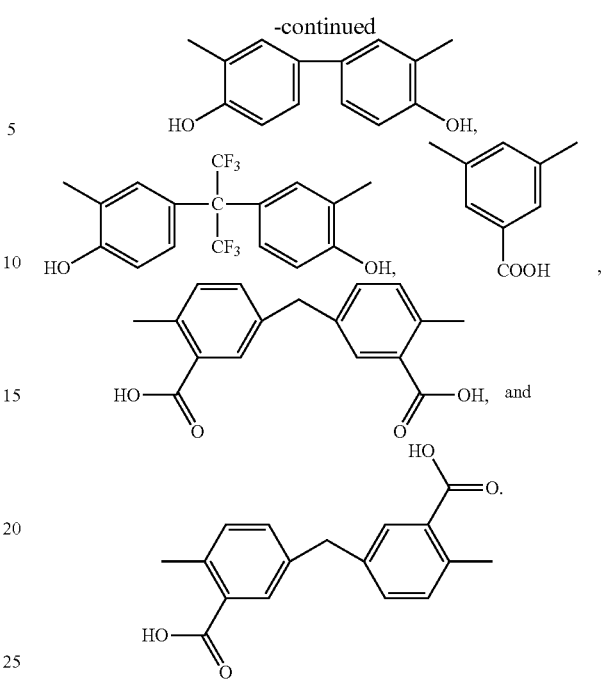

The synthesis steps of the photosensitive polyimide of component (c) were carried out by dissolving appropriate amount of the diamine monomer and the dianhydride monomer in N-methylpyrrolidone (NMP), followed by addition of another diamine monomer containing the phenol or carboxyl group to react at 80° C. for 2 hours, followed by addition of xylene and heating to 180° C. for 4 hours to obtain the distillate, which was then cooled. The amount of the photosensitive polyimide accounts for 30-90% of the solid weight of the photosensitive polyimide resin composition.

The amount of the photo initiator of component (d) accounts for 0.1-15% of the solid weight of the photosensitive polyimide resin composition. For example, the photo initiator may be selected from the following compounds: bis(2,4,6-trimethylbenzoyl)-phenylphosphine oxide, 2-phenylmethyl-2-dimethylamino-1-1-(4-morpholinophenyl)-butanone, (2,4,6-trimethylbenzyl)diphenylphosphine oxide, bis(2,6-difluoro-3-(1-hydropyrro-1-yl)-phenyl)titanocene, 4,4'-bis(dimethylamino)diphenyl ketone, 4,4'-bis(diethylamino) diphenyl ketone, or N-phenyl diethanolamine.

The method for preparing the photosensitive polyimide resin composition of the present invention was carried out by adding the infrared absorber, the epoxy compound, and the photo initiator into the photosensitive polyimide colloid prepared above to obtain the photosensitive polyimide resin composition.

The photosensitive polyimide resin composition of the present invention was coated on the substrate, and then dried and shaped to form the cover film. The method for shaping had two steps. After the resin composition was coated on the substrate, the soft baking (pre-baking) was carried out first at a temperature of about 100° C. for about 10 minutes to form a film, which was then exposed to, e.g., ultraviolet light and developed to leave the desired pattern. The composition was further subjected to hard baking and drying after development to allow the epoxy compound in the composition to be sufficiently crosslinked with other ingredients for avoiding peeling. The method of drying might be carried out, for example, by using the infrared lamp emitting infrared rays having a wavelength of 500-4000 nm at a temperature of 180 to 200° C. for an irradiation time of 10 to 30 minutes. The infrared lamp might be selected from the infrared halogen lamp, the infrared quartz tube, or the infrared blackbody tube.

EXAMPLE 1

19.88 g (80 mmol) of 1,3-bis (3-aminopropyl)-1,1,3,3-tetramethyldisiloxane, 80.7 g of N-methylpyrrolidone (NMP), 39.68 g (160 mmol) of bicyclo[2,2,2]oct-7-ene-2,3,5,6-tetracarboxylic dianhydride, and 21.14 g (80 mmol) of 2-(2-Methacryloyloxy)ethyl 3,5-diamino benzoate were added Into a 500 ml three-necked round bottom flask equipped with the mechanical stirrer and nitrogen inlet to form a solution. The solution was reacted at 50 to 80° C. for 2 hours. Afterwards, 45 g of xylene was added and the temperature was risen to 180° C. The mixture was kept stirring for 4 hours and then cooled to give a PIA-1 solution. 11.38 g of glycidyl methacrylate (GMA) was added into 50 g of the PIA-1 solution, which was then stirred at 70 to 100° C. for 24 hours to give the polyimide PSPI-1.

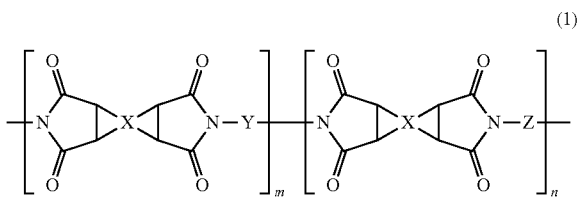

(1)

The structure of PSPI-1 was represented by formula (1) above, wherein X is

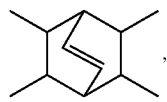

Y is

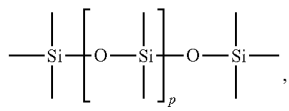

and p=0, Z is

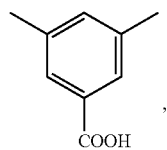

and m=n=120.

0.30 g of the infrared absorber (SDO-C33), 3.00 g of bis(2,4,6-trimethylbenzoyl)-phenylphosphine oxide, and 7.50 g of 1,4-butanediol diglycidyl ether were added into 60.00 g of PSPI-1 and mixed uniformly to obtain the photosensitive polyimide resin composition PSPI-IR1. PSPI-IR1 as coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

EXAMPLE 2

3.00 g of the infrared absorber (SDO-033), 3.00 g of bis(2,4,6-trimethylbenzoyl)phenylphosphine oxide, and 7.50 g of 1,4-butanediol diglycidyl ether were added into 60.00 g of PSPI-1 and mixed uniformly to obtain the photosensitive polyimide resin composition PSPI-IR2. PSPI-IR2 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

EXAMPLE 3

3.00 g of the infrared absorber (carbon black), 3.00 g of bis(2,4,6-trimethylbenzoyl)phenylphosphine oxide, and 7.50 g of 1,4-butanediol diglycidyl ether were added into 60.00 g of PSPI-1 and mixed uniformly to obtain the photosensitive polyimide resin composition PSPI-IR3. PSPI-R3 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

EXAMPLE 4

3.00 g of the infrared absorber (SDO-033), 3.00 g of bis(2,4,6-trimethylbenzoyl)phenylphosphine oxide, and 24.00 g of 1,4-butanediol diglycidyl ether were added into 60.00 g of PSPI-1 and mixed uniformly to obtain the photosensitive polyimide resin composition PSPI-IR4. PSPI-IR4 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

EXAMPLE 5

3.00 g of the infrared absorber (SDO-033), 0.30 g of bis(2,4,6-trimethylbenzoyl)phenylphosphine oxide, and 7.50 g of 1,4-butanediol diglycidyl ether were added into 60.00 g of PSPI-1 and mixed uniformly to obtain the photosensitive polyimide resin composition PSPI-IR5. PSPI-R5 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

COMPARATIVE EXAMPLE 1

3.00 g of bis(2,4,6-trimethylbenzoyl)phenylphosphine oxide and 24 g of 1,4-butanediol diglycidyl ether were added into 60.00 g of PSPI-1 and mixed uniformly to obtain the photosensitive polyimide resin composition PSPI-IR6. PSPI-IR6 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

COMPARATIVE EXAMPLE 2

3.00 g of the infrared absorber (SDO-C33) and 3.00 g of bis(2,4,6-trimethylbenzoyl)phenylphosphine oxide were added into 60.00 g of PSPI-1 and mixed uniformly to obtain the photosensitive polyimide resin composition PSPI-IR7. PSPI-IR7 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out at a wavelength of 500 nm to 4000 nm for 10 to 30 minutes to obtain a developed pattern with heat resistance.

COMPARATIVE EXAMPLE 3

3.00 g of the infrared absorber (SDO-C33), 3.00 g of bis(2,4,6-trimethylbenzoyl)phenylphosphine oxide, and 7.50 g of 1,4-butanediol diglycidyl ether were added into 60.00 g of PSPI-1 and mixed uniformly to obtain the photosensitive polyimide resin composition PSPI-IR2. PSPI-IR2 was coated on the substrate by using a wire bar. After the pre-baking procedure at 90° C. in the oven for 8 minutes, a film having a film thickness of about 15 μm was obtained. The film was then exposed to energy of about 400 mJ-cm$^2$ from the exposure machine (with a power of 7 kW) and then developed with 1 wt % (by weight) of sodium carbonate developer for 1 minute. After that, the hard baking procedure was carried out in nitrogen atmosphere at 200° C. in the hot air oven for 120 minutes to obtain a developed pattern with heat resistance.

COMPARATIVE EXAMPLE 4

3.00 g of the infrared absorber (SDO-C33) and 3.00 g of bis(2,4,6-trimethylbenzoyl)phenylphosphine oxide were added into 60.00 g of PSPI-1 and mixed uniformly to obtain the photosensitive polyimide resin composition PSPI-IR7. PSPI-IR7 was coated on the substrate by using a wire bar. After the pre-baking procedure at 90° C. in the oven for 8 minutes, a film having a film thickness of about 15 μm was obtained. The film was then exposed to energy of about 400 mJ/cm$^2$ from the exposure machine (with a power of 7 kW) and then developed with 1 wt % (by weight) of sodium carbonate developer for 1 minute. After that, the hard baking procedure was carried out in nitrogen atmosphere at 200° C. in the hot air oven for 120 minutes to obtain a developed pattern with heat resistance.

The photosensitive polyimide resin compositions of the Examples of the present invention and the Comparative Examples were soaked in the solvent, such as 10% HCl, 10% $H_2SO_4$, and 10% NaOH for 30 minutes, respectively, and then tested for the solvent resistance. The results are shown in Table 1 below:

TABLE 1

Formulations of photosensitive polyimide resin compositions and test results of solvent resistance thereof

| Photosensitive polyimide resin composition | Infrared absorber [component (a)] percentage[1] (wt %) $\frac{W_{(a)}}{W_{total} \times 0.5} \times 100\%$ | | Epoxy compound [component (b)] percentage $\frac{W_{(b)}}{W_{total} \times 0.5} \times 100\%$ | Photosensitive polyimide [component (c)] percentage $\frac{W_{(c)}}{W_{total} \times 0.5} \times 100\%$ | Photo initiator [component (d)] percentage $\frac{W_{(d)}}{W_{total} \times 0.5} \times 100\%$ | Hard baking conditions | | | Solvent resistance[2] |
|---|---|---|---|---|---|---|---|---|---|
| | SDO-C33 | Carbon black | | | | means | Temp. | time | |
| Example 1 | 0.74 | — | 18.38 | 73.53 | 7.35 | Infrared rays | 180° C. | 10 min | ○ |
| Example 2 | 6.90 | — | 17.23 | 68.97 | 6.90 | Infrared rays | 180° C. | 10 min | ○ |
| Example 3 | — | 6.90 | 17.23 | 68.97 | 6.90 | Infrared rays | 180° C. | 10 min | ○ |
| Example 4 | 5.00 | — | 40.00 | 50.00 | 5.00 | Infrared rays | 180° C. | 10 min | ○ |
| Example 5 | 7.35 | — | 18.38 | 73.53 | 0.74 | Infrared rays | 180° C. | 10 min | ○ |
| Comparative Example 1 | — | — | 18.52 | 74.07 | 7.41 | Infrared rays | 180° C. | 10 min | X |

TABLE 1-continued

Formulations of photosensitive polyimide resin compositions and test results of solvent resistance thereof

| Photosensitive polyimide resin composition | Infrared absorber [component (a)] percentage[1] (wt %) $\frac{W_{(a)}}{W_{total} \times 0.5} \times 100\%$ | | Epoxy compound [component (b)] percentage $\frac{W_{(b)}}{W_{total} \times 0.5} \times 100\%$ | Photosensitive polyimide [component (c)] percentage $\frac{W_{(c)}}{W_{total} \times 0.5} \times 100\%$ | Photo initiator [component (d)] percentage $\frac{W_{(d)}}{W_{total} \times 0.5} \times 100\%$ | Hard baking conditions | | | Solvent resistance[2] |
|---|---|---|---|---|---|---|---|---|---|
| | SDO-C33 | Carbon black | | | | means | Temp. | time | |
| Comparative Example 2 | 8.33 | — | — | 83.34 | 8.33 | Infrared rays | 180° C. | 10 min | X |
| Comparative Example 3 | 6.90 | — | 17.23 | 68.97 | 6.90 | Hot air oven | 200° C. | 120 min | X |
| Comparative Example 4 | 8.33 | — | — | 83.34 | 8.33 | Hot air oven | 180° C. | 120 min | X |

[1]Percentage represents the weight percentage (Wt %) of the "solid weight" of the photosensitive polyimide resin composition that the component accounts for. The solid percentage will vary depending on the formulation. The said in the Examples of the present invention or the Comparative Examples accounts for and therefore the denominator was multiplied by 0.5 in 50% of the total weight of the composition colloid, the calculation.
[2]The solvent resistance test was carried out by soaking the finished products in 10% HCl, 10% H$_2$SO$_4$, and 10% NaOH, respectively, for 30 minutes and performing the cross-cut (100/100) test to confirm whether or not the film of the photosensitive polyimide resin composition had peeled off. In the case of peeling, it meant that the composition was insufficiently crosslinked and recorded as X.

The photosensitive polyimide resin compositions of Examples 1-2 of the present invention used the same photo initiator and epoxy compound, but added different weight percentages (wt %) of dyes as the infrared absorber. Example 3 chose the pigment as the infrared absorber. Examples 4-5 used the same infrared absorber (dyes) and photo initiator, but added different weight percentages (wt %) of epoxy compound. After hard baking by infrared rays, all the photosensitive polyimide resin compositions of the Examples described above had excellent solvent resistance.

In contrast, the photosensitive polyimide resin composition of Comparative Example 1 was not added with the infrared absorber, and after the hard baking procedure with infrared rays having a wavelength of 500 nm to 4000 nm for 10 to 30 minutes, crosslinking was not achieved, resulting in poor solvent resistance. Though the photosensitive polyimide resin composition of Comparative Example 2 had infrared absorber, it didn't contain the epoxy compound. After the hard baking procedure with the same infrared rays, the solvent resistance was found to be equally poor. The formulation of the photosensitive polyimide resin composition of Comparative Example 3 was the same as that of Example 2 except that the hot baking was carried out by hot air drying for a longer period of time (120 minutes). However, the solvent resistance of the film was poorer. The photosensitive polyimide resin composition of Comparative Example 4 was the same as that of Comparative Example 2. Both comprised the infrared absorber but didn't contain the epoxy compound. Though the hard baking was carried out in the hot air oven for a longer period of time (120 minutes), the chemical resistance was still poor.

The traditional polyimide or photosensitive polyimide needs to be heated at a high temperature of about 350° C. for up to 2 hours for curing and being applicable in electronic components. The photosensitive polyimide resin composition of the present invention can achieve sufficient cross-linking and shaping inside the photosensitive polyimide resin composition using a lower temperature and a shorter heating time by adding the infrared absorber and the epoxy compound in cooperation of the infrared irradiation. Therefore, not only is the yield improved (without high temperature damage to the electronic components), but the process time is significantly saved.

While the present invention has been illustrated above by the Examples, these Examples are not intended to limit the invention. Equivalent implementations or alterations may be made to these Examples by those skilled in the art without departing from the scope of the spirit of the art of the invention. Therefore, the protection scope of the present invention should be determined by the appended claims.

What is claimed is:
1. A photosensitive polyimide resin composition, comprising:
(a) a dye or a pigment serving as an infrared absorber, accounting for 5-40% of the solid weight of the photosensitive polyimide resin composition;
(b) an epoxy compound accounting for 5-40% of the solid weight of the photosensitive polyimide resin composition;
(c) a photosensitive polyimide having a structure of formula (1):

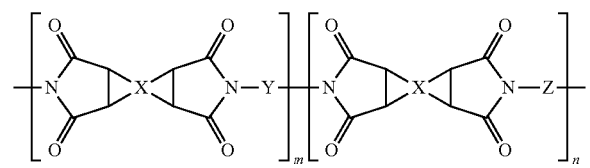

wherein m and n are independently 1 to 600; X is a tetravalent organic group, a main chain of which contains an alicyclic group; Y is a divalent organic group, a main chain of which contains a siloxane group; Z is a divalent organic group, a side chain of which at least contains a phenolic group or a carboxyl group; and the photosensitive polyimide accounts for 30-90% of the solid weight of the photosensitive polyimide resin composition; and
(d) a photo initiator accounting for 0.1-15% of the solid weight of the photosensitive polyimide resin composition,
wherein the epoxy compound is neopentyl glycol diglycidyl ether, 1,4-butanediol diglycidyl ether, 1,2-cyclohexanedicarboxylic acid diglycidyl ester, bisphenol A diglycidyl ether, 1,2-propanediol diglycidyl ether, trimethylolpropane triglycidyl ether, glycerol tripropoxy triglycidyl ether, m-benzenediol diglycidyl ether, or a combination thereof.

2. The photosensitive polyimide resin composition of claim 1, wherein the dye is a metal complex dye or a condensed polycyclic dye.

3. The photosensitive polyimide resin composition of claim 1, wherein the pigment is an organic pigment or an inorganic pigment.

4. The photosensitive polyimide resin composition of claim 1, wherein X of formula (1) doesn't contain a benzene ring.

5. The photosensitive polyimide resin composition of claim 4, wherein X of formula (1) is

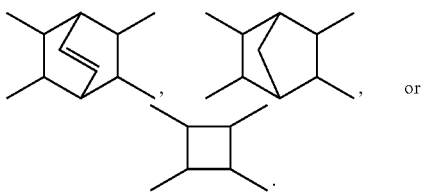

6. The photosensitive polyimide resin composition of claim 1, wherein Y of formula (1) is

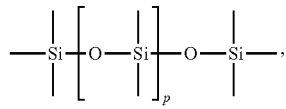

wherein p=0-20.

7. The photosensitive polyimide resin composition of claim 1, wherein the phenolic group or the carboxyl group of Z in formula (1) accounts for 5-30% of the total number of moles of the photosensitive polyimide.

8. The photosensitive polyimide resin composition of claim 7, wherein Z of formula (1) is

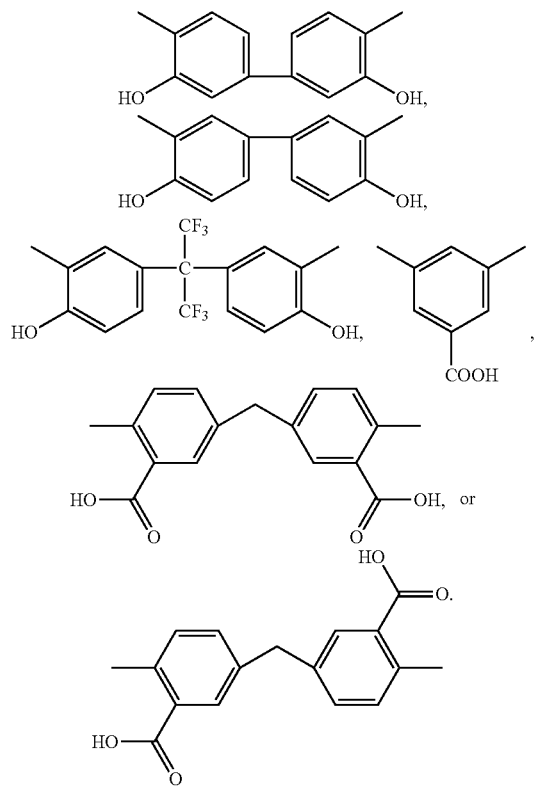

9. The photosensitive polyimide resin composition of claim 1, wherein the photo initiator is bis(2,4,6-trimethylbenzoyl)-phenylphosphine oxide, 2-phenylmethyl-2-dimethylamino-1-1-(4-morpholinophenyl)-butanone, (2,4,6-trimethylbenzyl)diphenylphosphine oxide, bis(2,6-difluoro-3-(1-hydropyrro-1-yl)-phenyl)titanocene, 4,4'-bis (dimethylamino)diphenyl ketone, 4,4'-bis(diethylamino) diphenyl ketone, or N-phenyl diethanolamine.

10. The photosensitive polyimide resin composition of claim 1, wherein the photosensitive polyimide resin composition is used for forming an insulating film.

* * * * *